(12) United States Patent
Kuo et al.

(10) Patent No.: US 9,587,929 B2
(45) Date of Patent: Mar. 7, 2017

(54) FOCUS METROLOGY METHOD AND PHOTOLITHOGRAPHY METHOD AND SYSTEM

(71) Applicant: TAIWAN SEMICONDUCTOR MANUFACTURING CO., LTD., Hsinchu (TW)

(72) Inventors: Hung-Ming Kuo, Chubei (TW); Jui-Chun Peng, Hsinchu (TW); Heng-Hsin Liu, New Taipei (TW); Yung-Yao Lee, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 44 days.

(21) Appl. No.: 14/332,116

(22) Filed: Jul. 15, 2014

(65) Prior Publication Data
US 2016/0018743 A1 Jan. 21, 2016

(51) Int. Cl.
*G03B 27/52* (2006.01)
*G03B 27/68* (2006.01)
*G01B 11/06* (2006.01)
*G03F 7/20* (2006.01)
*G03F 9/00* (2006.01)

(52) U.S. Cl.
CPC ...... *G01B 11/0608* (2013.01); *G03F 7/70641* (2013.01); *G03F 9/7026* (2013.01)

(58) Field of Classification Search
CPC .................. G03F 7/70333; G03F 7/70641
USPC .................... 355/52, 53, 55; 356/237.2
See application file for complete search history.

(56) References Cited

U.S. PATENT DOCUMENTS

| | | | | |
|---|---|---|---|---|
| 5,602,400 A * | 2/1997 | Kawashima | .......... | G03F 9/7026 250/548 |
| 6,118,515 A * | 9/2000 | Wakamoto | .......... | G03F 7/70358 355/53 |
| 7,660,696 B1 * | 2/2010 | Norton | ............... | G01N 21/9501 356/601 |
| 7,746,484 B2 * | 6/2010 | Van De Vin | ........... | G03B 27/58 356/614 |
| 2002/0039694 A1* | 4/2002 | Scheiberlich | ......... | G03F 9/7034 430/30 |
| 2005/0167568 A1* | 8/2005 | Amar | ................. | G01N 21/9501 250/201.2 |
| 2008/0085462 A1* | 4/2008 | Best | .................... | G03F 7/70333 430/269 |
| 2011/0109889 A1* | 5/2011 | Van De Vin | ........... | G03B 27/58 355/55 |

* cited by examiner

*Primary Examiner* — Hung H Nguyen
(74) *Attorney, Agent, or Firm* — Maschoff Brennan

(57) ABSTRACT

The present disclosure provides a focus metrology method and photolithography method and system. The focus metrology method includes recognizing at least one relevant region and at least one irrelevant region on a workpiece surface, measuring a height of the relevant region and determining a focal length for an exposure process based on the measured height of the relevant region.

20 Claims, 9 Drawing Sheets

FOCUS METROLOGY METHOD AND PHOTOLITHOGRAPHY METHOD AND SYSTEM

BACKGROUND

The present disclosure relates to focus metrology.

A photolithography system is a machine that applies a pattern onto a substrate, usually onto a target portion of the substrate. A photolithography system can be used, for example, in the manufacture of integrated circuits (ICs). In that instance, a mask or a reticle may be used to generate a circuit pattern to be formed on an individual layer of the IC. This pattern can be transferred onto a target portion of a substrate. Transfer of the pattern is typically via imaging onto a resist provided on the substrate.

During the operation of the photolithography system, a plurality of parameters of an operation recipe for the photolithography system should be determined base on the surface of the substrate. The focal length is one of them. If the focal length is incorrectly determined, the pattern imaged onto the resist will be out of focus and thus blurred.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
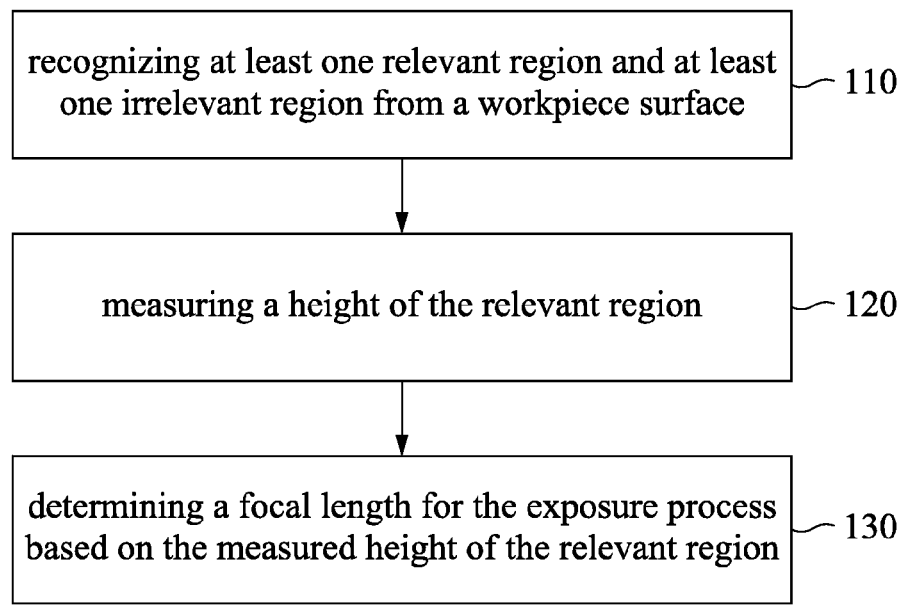
FIG. 1 is a flow chart of a focus metrology method in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As the complexity of the circuit pattern increases, the quality requirement for the pattern imaged onto the resist increases. If the pattern imaged onto the resist is out of focus or blurred, some details of the pattern will be lost, causing the photolithography process to fail.

FIG. 1 is a flow chart of a focus metrology method 100 in accordance with various embodiments of the present disclosure. The focus metrology method 100 includes the following operations. At least one relevant region and at least one irrelevant region are recognized from a workpiece surface (operation 110). A height of the relevant region is measured (operation 120). A focal length for an exposure process is determined based on the measured height of the relevant region (operation 130). The following description illustrates how to perform the aforementioned operations 110-130 with reference to FIGS. 2-4.

Figure 2:
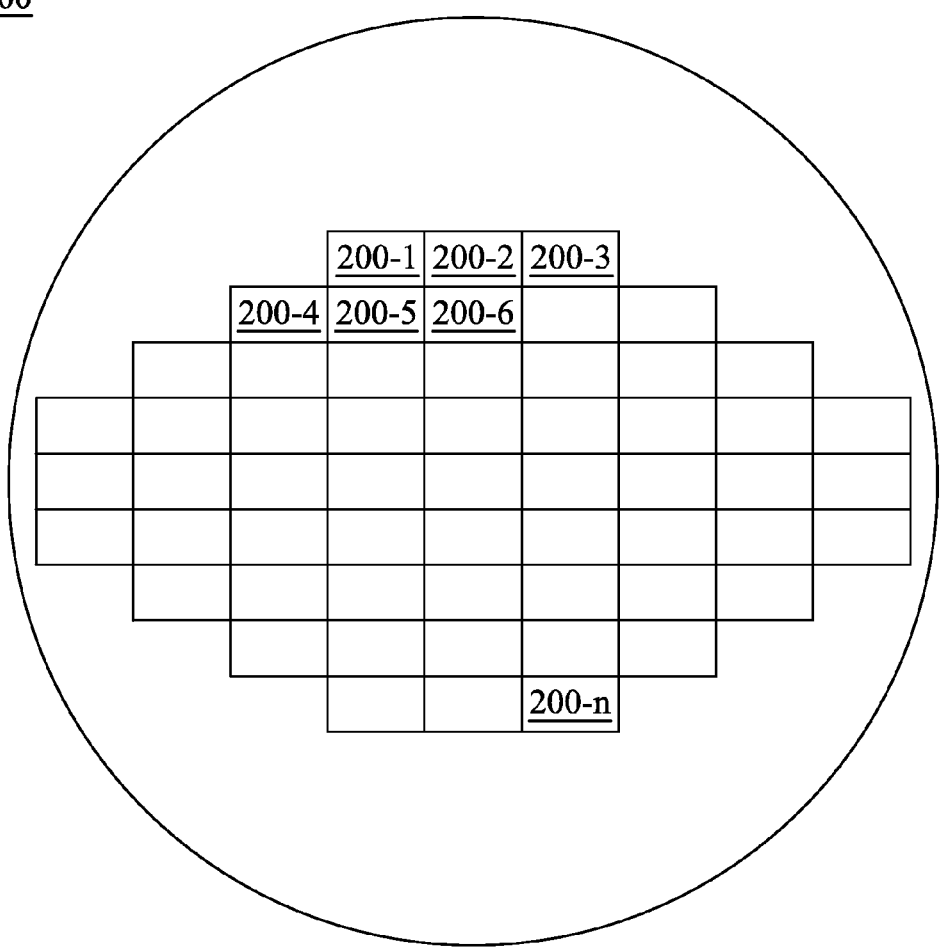
FIG. 2 is a top view of a wafer in accordance with various embodiments of the present disclosure.
Figure 3:
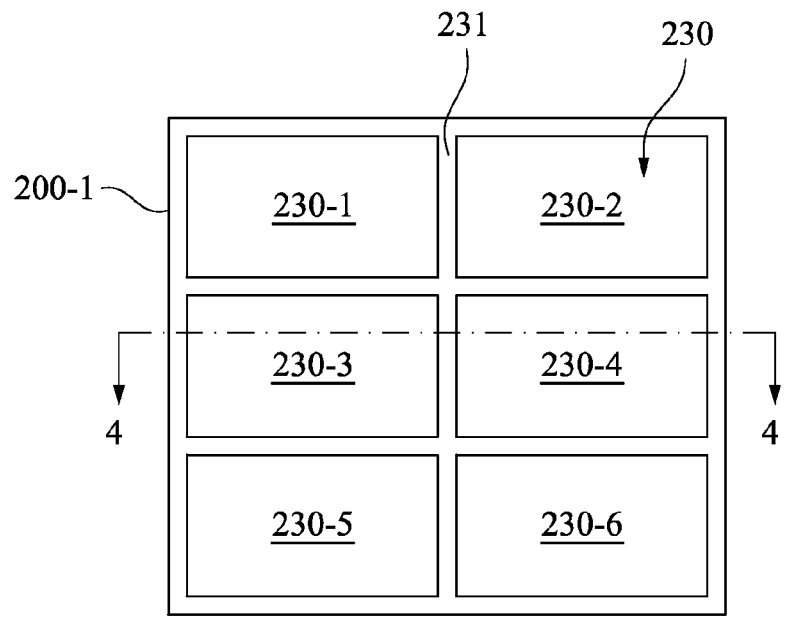
FIG. 3 is an enlarged top view of a field in FIG. 2 in accordance with various embodiments of the present disclosure.
Figure 4:
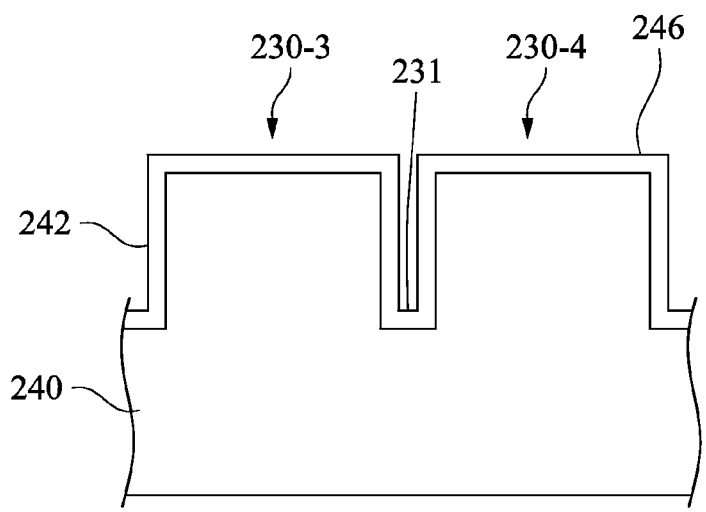
FIG. 4 is a sectional view taken along the line 4 of FIG. 3.

FIG. 2 is a top view of a wafer 200 in accordance with various embodiments of the present disclosure. FIG. 3 is an enlarged top view of a field 200-1 in FIG. 2. FIG. 4 is a sectional view taken along the line 4 of FIG. 3. In operation 110, the relevant region 230 and the irrelevant region are recognized from the workpiece surface 246. The workpiece is, for example, the wafer 200, but is not limited thereto. The workpiece surface 246 is, for example, a surface of the wafer 200. More specifically, the wafer 200 may include a photoresist layer 242 and a wafer substrate 240. The photoresist layer 242 is disposed on the wafer substrate 240. The wafer substrate 240 is made of, for example, a semiconductor material.

As shown in FIG. 2, the wafer 200 is divided into a plurality of exposure fields 200-1, 200-2, 200-3, 200-4, 200-5, 200-6, . . . , and 200-n. An exposure field is an area of the wafer 200 exposed by an exposure process. So, when the wafer 200 is subjected to a photolithography process, an exposure process transfers a pattern to one of the exposure fields 200-1, 200-2, . . . 200-n to form integrated circuits within one of the exposure fields 200-1, 200-2, . . . 200-n. When an exposure field is exposed, one or more dies or chips within the exposure field are patterned.

That is, at least one of the exposure fields, e.g. the exposure field 200-1, includes one or more die areas, so as to fabricate one or more dies or chips within one exposure field. As shown in FIG. 3, the exposure field 200-1 has a plurality of die areas 230-1, 230-2, 230-3, 230-4, 230-5, and 230-6 therein. Furthermore, the exposure field 200-1 further includes at least one scribe region 231 formed around each of the die areas 230-1, 230-2, 230-3, 230-4, 230-5, and 230-6, so as to separate the die areas 230-1, 230-2, 230-3, 230-4, 230-5, and 230-6 from each other.

In some embodiments, in operation 110, a position of the scribe region 231 on the surface of the wafer 200 is obtained, and the scribe region 231 is recognized as the irrelevant region based on the position of the scribe region 231. On the other hand, the die areas 230-1, 230-2, 230-3, 230-4, 230-5, and 230-6 are recognized as the relevant regions.

In some embodiments, the position of the scribe region 231 can be obtained by accessing the database in the exposure tool. More specifically, the reticle of the exposure tool includes a circuit pattern to be transferred onto one of the exposure fields 200-1, 200-2, . . . 200-n, and the circuit pattern of the reticle can be obtained by accessing the database in the exposure tool in advance. Therefore, the position of the scribe region 231 can be determined based on the circuit pattern of the reticle.

In operation 120, a height of the relevant region 230, e.g. the die areas 230-1, 230-2, 230-3, 230-4, 230-5 and/or 230-6, is measured. In some embodiments, the height of the relevant region 230 is measured by optical means. The optical means measures the height of the relevant region 230 by directing a wave onto the workpiece surface 246, detecting reflected wave from the workpiece surface 246, and determining measures the height of the relevant region 230 by the height of the relevant region 230 based on the reflected wave. More specifically, the optical means for measuring the height of the relevant region 230 may be, for example, a phase measurement interferometry or a displacement meter, but is not limited thereto. The phase measurement interferometry and the displacement meter are capable of measuring surface topography of the workpiece surface 246 including the relevant region 230. The phase measurement interferometry involves creating interference patterns through interaction of waves, e.g. electromagnetic waves, with the surface of the relevant region 230 and detecting the interference patterns, where the detected interference patterns are used to reconstruct the surface topography of the workpiece surface 246. The displacement meter detects light reflected by the surface of a target, for example, the surface of the relevant region 230 and the surface of the scribe region 231, and analyzes the displacement of the reflected light to reconstruct the surface topography of the workpiece surface 246.

Figure 5:
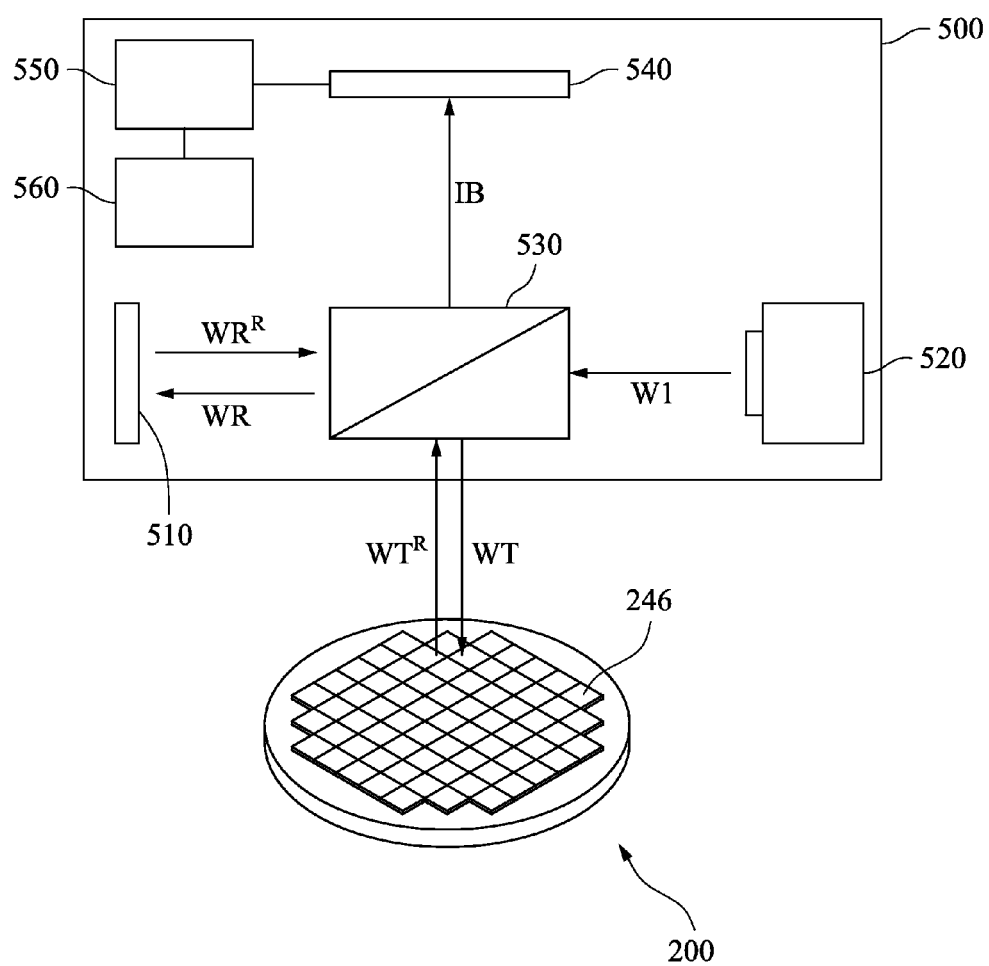
FIG. 5 is a schematic view of an interferometer for measuring surface topography of a wafer in accordance with various embodiments of the present disclosure.

FIG. 5 is a schematic view of an interferometer 500 for measuring surface topography of the wafer 200. The interferometer 500 detects surface topography by comparing the workpiece surface 246 with a reference surface 510. The reference surface 510 is a flat surface and has a known surface topography. In some embodiments, the reference surface 510 is a front-surface mirror, but is not limited thereto. The interferometer 500 includes a wave source 520 which can provide a wave W1. In some embodiments, the wave W1 may be an electromagnetic wave with a wavelength in a range from about 200 nm to about 1200 nm. For example, the wave source 520 may emit ultraviolet light, visible light, or infrared light.

The interferometer 500 may further include a polarization beam splitter 530. The polarization beam splitter 530 may split the wave W1 into two orthogonally polarized waves WT and WR. The wave WT is coherent with and spatially phase shifted or phase-separated relative to the wave WR. The two orthogonally polarized waves WT and WR produced by the polarization beam splitter 530 are respectively directed to the workpiece surface 246 and the reference surface 510 and get reflected back to the polarization beam splitter 530 as reflected waves $WT^R$ and $WR^R$, respectively. The path lengths of the reflected waves $WT^R$ and $WR^R$ are respectively influenced by the topography of the workpiece surface 246 and the reference surface 510.

More specifically, when the wave WT is incident upon the workpiece surface 246, part of the wave WT get reflected back into the interferometer 500 as the reflected wave $WT^R$. The reflected wave $WT^R$ recombines with the reflected wave $WR^R$ from the reference surface 510 to create an interference wave IB. The interferometer 500 may further include an imaging module 540. The imaging module 540 detects and measures the interference wave IB to determine the topography of the workpiece surface 246. As a result, the heights of the relevant region 230 and the irrelevant region, e.g. the scribe region 231, are determined. That is, a first distance from the interferometer 500 to the surface of the relevant region 230 is measured, and a second distance from the interferometer 500 to the surface of the irrelevant region is measured as well.

In some embodiments, the measured height of the irrelevant region, e.g. the scribe region 231, is ignored or removed to prevent the focus length for the following exposure process from being incorrectly determined. Since the irrelevant region, e.g. the scribe region 231, is irrelevant to the integrated circuits formed on the wafer 200, if the irrelevant region, e.g. the scribe region 231, is considered when determining the focus length, the focus length will be incorrectly determined, especially when the height of the irrelevant region, e.g. the scribe region 231, is an extreme value.

In some embodiments, the interferometer 500 may further include a data acquisition module 550 and an analyzer 560. The data acquisition module 550 collects measured data from the imaging module 540. The analyzer 560 processes the measured data. Specifically, the analyzer 560 executes a process which reconstructs the surface topography of the wafer 200 from the measured data. Thus, the height of the relevant region 230 and the height of the irrelevant region can be measured. Since the irrelevant region is recognized in operation 110, the measured height of the irrelevant region can be ignored or removed. That is, the measured second distance from the interferometer 500 to the surface of the irrelevant region is ignored or removed.

Figure 6:
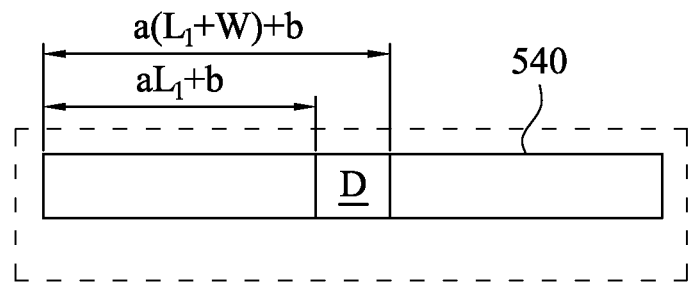
FIG. 6 is a schematic view of the disabled part of the imaging module in accordance with various embodiments of the present disclosure.
Figure 6:
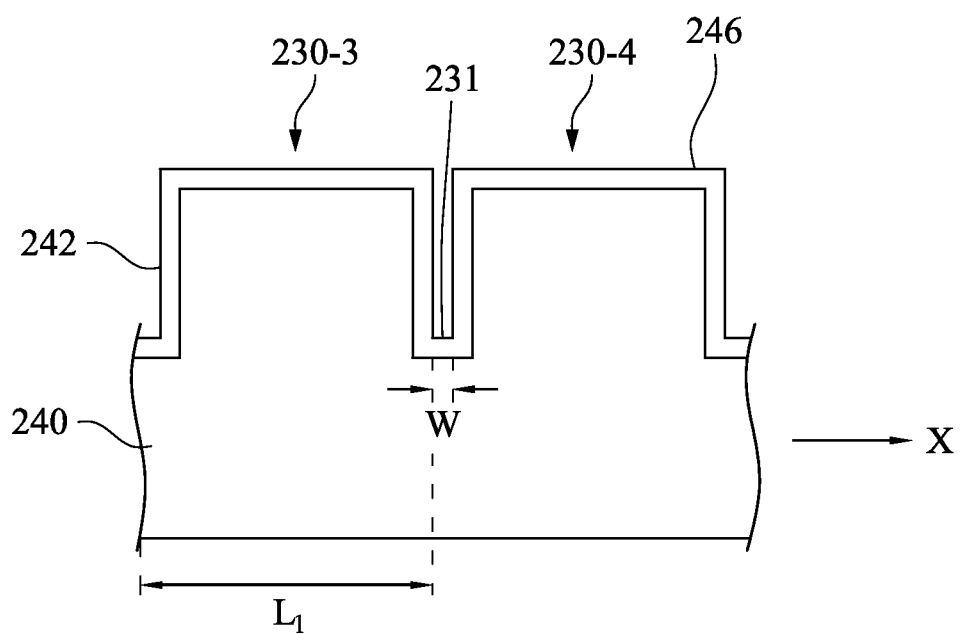

In some embodiments, operation 120 includes disabling a part of the imaging module 540 corresponding to the irrelevant region and measuring the height of the relevant region 230 by the remaining imaging module 540. FIG. 6 is a schematic view of the disabled part D of the imaging module 540. Since the irrelevant region, e.g. the scribe region 231, are recognized in operation 110, a part D of the imaging module 540 corresponding to the irrelevant region, e.g. the scribe region 231, can be disabled.

The X-axis position of the left end of the disabled part D can be expressed as "aL1+b", where L1 is the X-axis position of the left end of the scribe region 231, which can be determined based on the circuit pattern of the reticle, and a and b are scale parameters. The X-axis position of the right end of the disable part D can be expressed as "a(L1+W)+b", where W is the width of the scribe region 231, which can be determined based on the circuit pattern of the reticle. In this way, the disable part D of the imaging module 540 can be determined, and the height of the relevant region 230 can be measured by the remaining imaging module 540.

Figure 7:
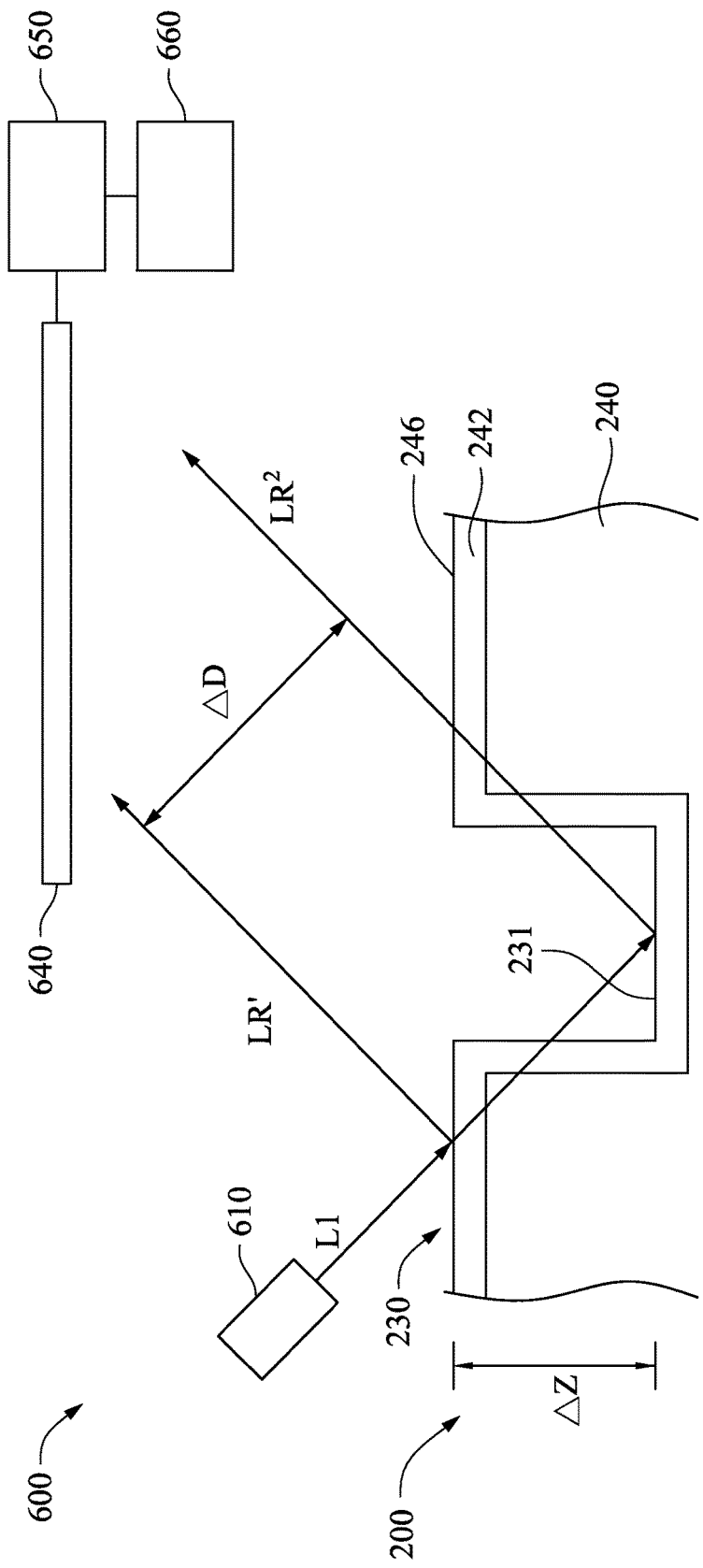
FIG. 7 is a schematic view of a displacement meter for measuring surface topography of a wafer in accordance with various embodiments of the present disclosure.

FIG. 7 is a schematic view of a displacement meter 600 for measuring surface topography of the wafer 200. The displacement meter 600 includes a wave source 610 for providing a wave L1 to the wafer 200 and an imaging module 640 for detecting the wave reflected by the wafer 200. The wafer 200 may include a photoresist layer 242 and a wafer substrate 240. The photoresist layer 242 is disposed on the wafer substrate 240. The photoresist layer 242 and the wafer substrate 240 may be transparent to the wave L1, and thus the wave L1 is partially reflected by the relevant region 230 and is partially reflected by the scribe region 231. In some embodiments, the wave L1 may have a wavelength in a range from about 200 nm to about 1200 nm. For example, the wave source 610 may emit ultraviolet light, visible light, or infrared light.

As shown in FIG. 7, the relevant region 230 partially reflects the wave L1, and the imaging module 640 receives the reflected wave $LR^1$. The scribe region 231 partially reflects the wave L1, and the imaging module receives the reflected wave $LR^2$. A height difference $\Delta Z$ between the relevant region 230 and the scribe region 231 can be calculated from a displacement $\Delta D$ between the reflected wave $LR^1$ and the reflected wave $LR^2$. Furthermore, a receiving time difference between the reflected waves $LR^1$ and $LR^2$ means a difference between the lengths of paths where the reflected waves $LR^1$ and $LR^2$ travel. Therefore, the height difference $\Delta Z$ between the relevant region 230 and the scribe region 231 can be calculated from the receiving time difference as well. As a result, the heights of the relevant region 230 and the irrelevant region, e.g. the scribe region 231, are determined.

In some embodiments, the displacement meter 600 may further include a data acquisition module 650 and an analyzer 660. The data acquisition module 650 collects measured data from the imaging module 640. The analyzer 660 processes the measured data to reconstruct the surface topography of the wafer 200. Similarly, the measured height of the irrelevant region, e.g. the scribe region 231, can be ignored or removed to prevent the focus length for the following exposure process from being incorrectly determined.

In some embodiments, the operation 120 includes disabling a part of the imaging module 640 corresponding to the irrelevant region and measuring the height of the relevant region 230 by the remaining imaging module 640. Generally, the operation of the imaging module 640 of FIG. 7 is similar to that of the imaging module 540 of FIG. 5 and therefore is not repeated here to avoid duplicity.

In operation 130, a focal length for the following exposure process is determined based on the measured height of the relevant region 230. After the focal length is determined, the exposure process is performed to focus a pattern of light onto the workpiece surface 246 with the focal length. Therefore, the circuit pattern of the reticle can be transferred onto the surface of the relevant region 230, more specifically onto the photoresist layer 242. In some embodiments, the focal length is determined without considering the irrelevant region, e.g. the scribe region 231, to ensure that the pattern imaged onto the relevant region 230 is in focus.

Figure 8A:
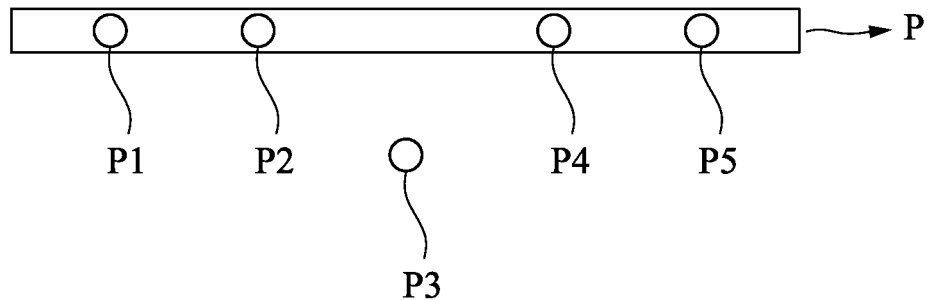
FIG. 8A shows a focal plane determined without considering the irrelevant region.
Figure 8B:
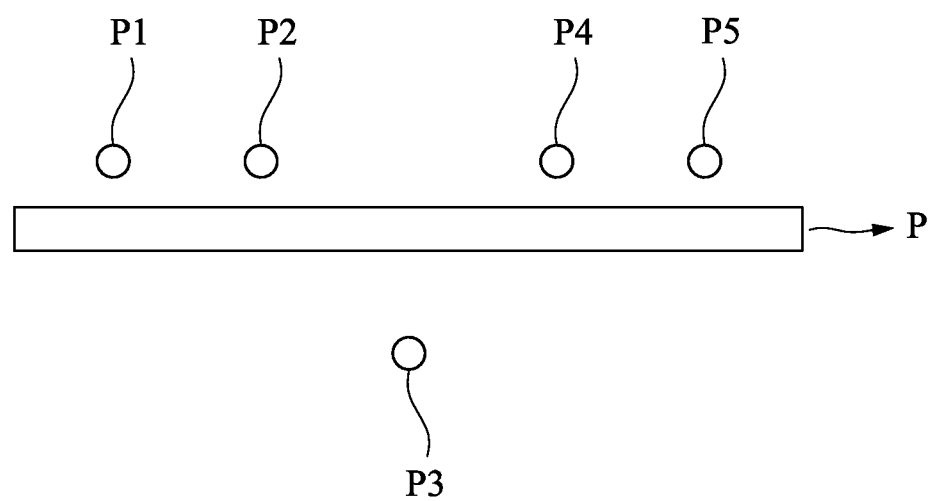
FIG. 8B shows a focal plane determined with considering the irrelevant region.

FIG. 8A shows a focal plane P determined without considering the irrelevant region, and FIG. 8B shows a focal plane P determined with considering the irrelevant region. As shown in FIGS. 8A and 8B, dots P1, P2, P3, P4, and P5 respectively represent heights of a plurality of points on the workpiece surface 246, in which the dot P3 represents the height of the point within the irrelevant region, e.g. the scribe region 231, and the dots P1, P2, P4, and P5 represent the heights of the points within the relevant region 230, e.g. the die areas 230-1, 230-2, 230-3, 230-4, 230-5, and 230-6.

As shown in FIG. 8A, since the focal plane P is determined based on the dots P1, P2, P4, and P5 and without considering the dot P3, the dots P1, P2, P4 and P5 are on the focal plane P, causing the pattern imaged onto the photoresist layer 246 to be in focus. In the contrary, as shown in FIG. 8B, since the focal plane P is determined based on the dots P1, P2, P3, P4 and P5, the dot P3 would pull down the focal plane P. As a result, none of the dots P1, P2, P4, and P5 is on the focal plane P, causing the pattern imaged onto the photoresist layer 246 to be out of focus and blurred.

Figure 9:
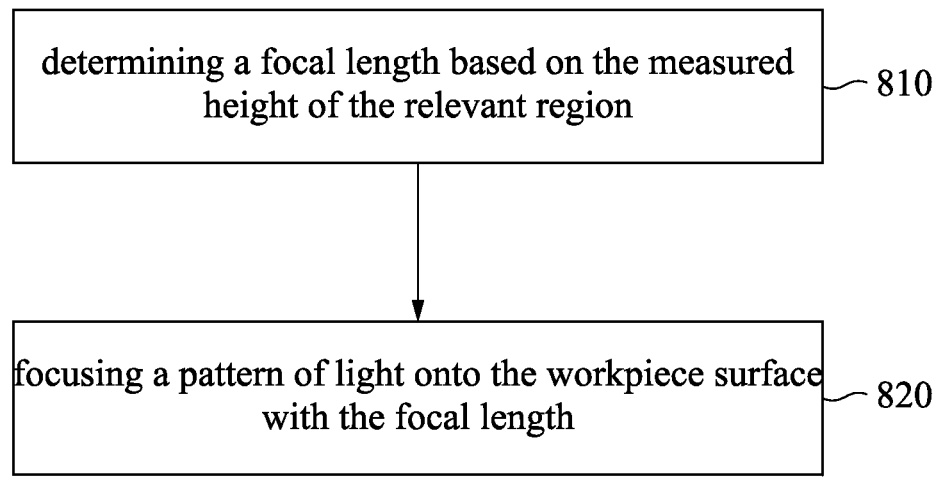
FIG. 9 is a flow chart of a photolithography method in accordance with various embodiments of the present disclosure.

FIG. 9 is a flow chart of a photolithography method 800 in accordance with some embodiments of the present disclosure. The photolithography method 800 includes the following operations. A focal length is determined based on the measured height of the relevant region 230 (operation 810). A pattern of light is focused onto the workpiece surface 246 with the focal length (operation 820).

The photolithography method 800 determines the focal length based on the measured height of the relevant region 230 and without considering the irrelevant region, e.g. the scribe region 231, so that the pattern of light can be focused onto the relevant region 230 with an appropriate focal length. Therefore, the pattern can be imaged onto the relevant region 230 in focus, thereby facilitating critical dimension control.

Figure 10:
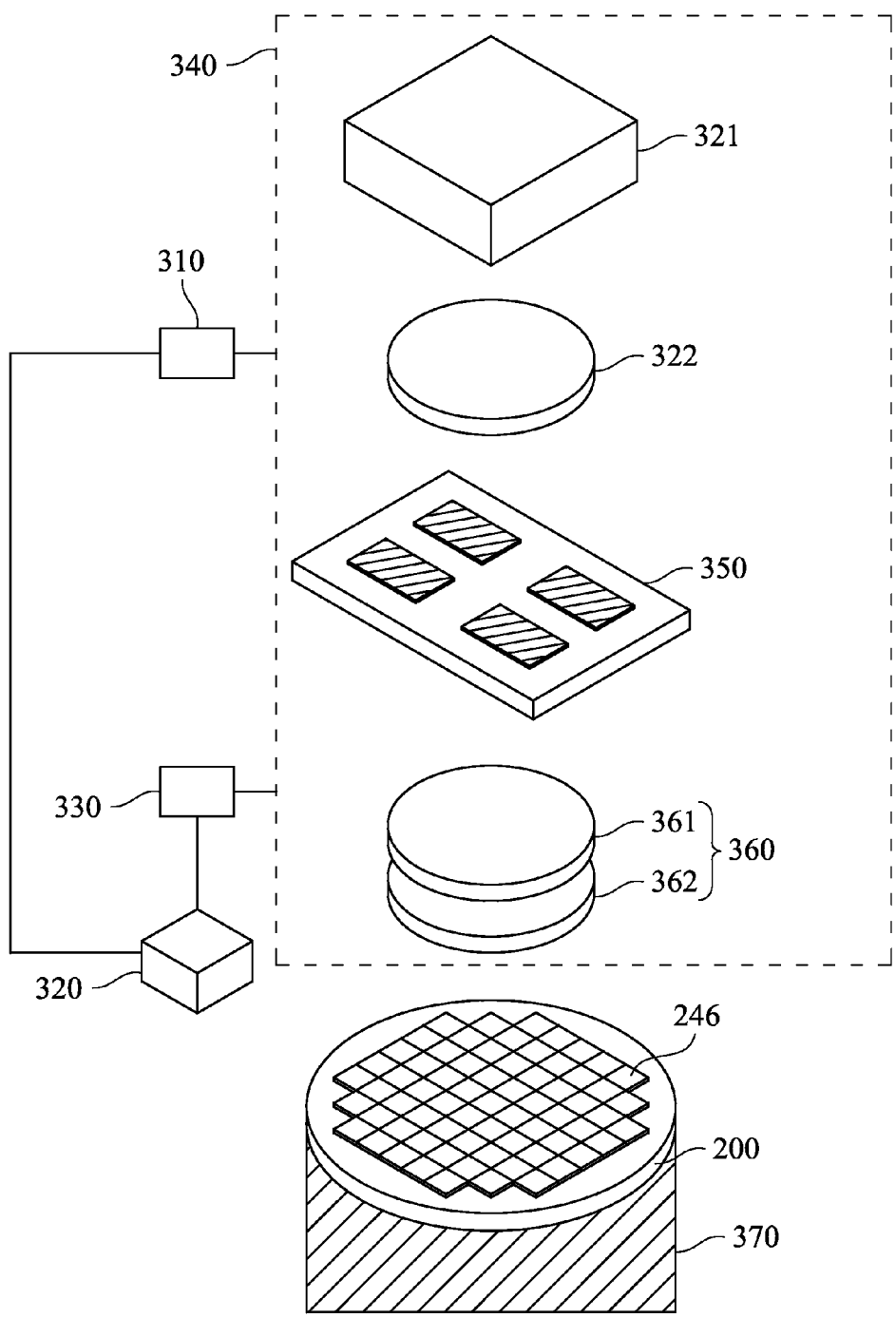
FIG. 10 is a schematic view of a photolithography system in accordance with various embodiments of the present disclosure.

FIG. 10 is a schematic view of a photolithography system 300 in accordance with some embodiments of the present disclosure. It should be understood that the configuration of the photolithography system 300 in FIG. 10 is illustrated for clarity and for convenience to explain the embodiments. Other configurations and inclusion or omission of the photolithography system 300 may be possible. As shown in FIG. 10, the photolithography system 300 includes a recognizer 310, a focus metrology tool 320, a controller 330, and an exposure tool 340. The recognizer 310 is configured to recognize at least one relevant region 230 and at least one irrelevant region, e.g. a scribe region 231, from a workpiece surface 246. The focus metrology 320 is configured to measure a height of the relevant region 230. The controller 330 is configured to determine a focal length for the exposure tool 340 based on the measured height of the relevant region 230. The exposure tool 340 is configured to focus a pattern of light onto the workpiece surface 246 with the focal length.

The recognizer 310 recognizes the relevant region 230 and the irrelevant region, e.g. the scribe region 231, according to the information provided by the exposure tool 340. More specifically, the reticle of the exposure tool 340 includes a circuit pattern to be transferred onto at least one of the exposure fields 200-1, 200-2, . . . 200-n, and the circuit pattern of the reticle is known information that can be obtained in advance. Therefore, the position of the scribe region 231 can be determined based on the circuit pattern of the reticle. In some embodiments, the recognizer 310 is, for example, a computer programmed with software to implement the function described. Alternately, a hardware calculating unit designed to implement the functions described may also be used.

The focal metrology tool 320 may include a surface metrology tool, such as the interferometer 500 or the displacement meter 600. As shown in FIG. 5, the interferometer 500 is configured to measure topography of the workpiece surface 246. The interferometer 500 detects surface topography by comparing the workpiece surface 246 with a reference surface 510. The reference surface 510 is a flat surface and has a known surface topography. In some embodiments, the focus metrology tool 320 may have a measuring diameter in a range from about 1 mm to about 450 mm.

As shown in FIG. 5, the interferometer 500 may include a wave source 520, a polarization beam splitter 530, an imaging module 540, and an analyzer 560. The wave source 520 provides a wave W1. The polarization beam splitter 530 is configured to split the wave W1 into two polarized waves WT and WR respectively directed to the workpiece surface 246 and a reference surface 510. The imaging module 540 is configured to detect an interference wave IB created by recombining two reflected polarized waves $WT^R$ and $WR^R$ respectively from the workpiece surface 246 and the reference surface 510. The analyzer 560 is configured to determine the height of the relevant region 230 based on the interference wave IB.

As shown in FIG. 7, the displacement meter 600 is configured to detect the waves reflected by the workpiece surface 246 including the surface of the relevant region 230 and the surface of the scribe region 231 and to analyze the displacement of the reflected waves $LR^1$ and $LR^2$ to reconstruct the workpiece surface 246.

The displacement meter 600 may include a wave source 610, an imaging module 640, and an analyzer 660. The wave source 610 is configured to provide a wave L1 to the workpiece surface 246. The imaging module 640 is configured to detect the reflected waves $LR^1$ and $LR^2$ respectively reflected by the relevant region 230 and the scribe region 231. The analyzer 660 is configured to determine the height of the relevant region 230 based on the reflected waves $LR^1$ and $LR^2$.

In some embodiments, the imaging module 540 or 640 may include a plurality of line scan sensors for detecting the interference wave IB. The analyzer 560 or 660 is, for example, a computer programmed with software to implement the function described. Alternately, a hardware calculating unit designed to implement the functions described may also be used.

In some embodiments, the controller 330 is configured to disable a part of the focus metrology tool 320 corresponding to the irrelevant region, i.e. the scribe region 231, such that the height of the relevant region 230 is measured by the remaining focus metrology tool 320. More specifically, the controller 330 is configured to disable a part D of the imaging module 540 or 640.

In some embodiments, the focus metrology tool 320 is configured to measure the height of the relevant region 230 and a height of the irrelevant region, e.g. the scribe region 231. The controller 330 is configured to ignore the measured height of the irrelevant region, i.e. the scribe region 231, in determining the focal length.

The controller 330 is, for example, a computer programmed with software to implement the function described. Alternately, a hardware calculating unit designed to implement the functions described may also be used.

The exposure tool 340 includes a light source 321, a condenser lens system 322, a reticle 350, and a reduction lens system 360. Before the exposure tool 340 transfers the circuit pattern onto the workpiece surface 246, the focus metrology tool 320 determines the focal length for the exposure tool 340 by the focus metrology method 100, so that the circuit pattern can be transferred onto the surface of the relevant region 230 in focus.

The light source 321 of the exposure tool 340 is, for example, a mercury lamp with a wavelength of about 436 nm (G-line) or about 365 nm (I-line); a Krypton Fluoride (KrF) excimer laser with a wavelength of about 248 nm; an Argon Fluoride (ArF) excimer laser with a wavelength of about 193 nm; a Fluoride ($F_2$) excimer laser with a wavelength of about 157 nm; or other light sources with a wavelength below approximately 100 nm.

The reticle 350 includes the circuit pattern. The light beam emitted from the light source 321 may be partially blocked when hitting on the reticle 350. Therefore, a pattern of light can be formed on the workpiece surface 246.

The condenser lens system 322 may include a single lens or a lens system having multiple lenses or other lens components. For example, the condenser lens system 322 may include microlens arrays, or other structures designed to aid in directing light from the light source 321 onto the reticle 350.

The reduction lens system 360 may include a single lens element or a plurality of lens elements such as ones illustrated as 361, and 362 in FIG. 9. Each lens element 361, 362 may include a transparent substrate. The materials used for each lens element 361, 362 may be chosen based on the wavelength of light used in the exposure tool 340 to minimize absorption and scattering.

With reference made to FIG. 9, a stage 370 may be used to secure the workpiece, e.g. the wafer 200, for receiving radiation energy through the lens system (such as the reduction lens system 360 and the condenser lens system 322). Further, the stage 370 is operable to support relative movement between the workpiece surface 246 and the lens system according to the focal length. More specifically, the workpiece 246 is placed on the stage 370, and the stage 370 is capable of moving in translational and rotational modes such that the wafer 200 may be aligned with the reticle 350 and can adjust the position of the workpiece surface 246 according to the focal length, so as to transfer the circuit pattern onto the surface of the relevant region 230, specifically on the surface of the photoresist layer 242 disposed on the relevant region 230.

In order to prevent the pattern imaged onto the workpiece surface, i.e. the photoresist layer, from being out of focus and blurred, a focus metrology method is provided. The focus metrology method is designed to determine a focal length for the following exposure without considering the irrelevant region, e.g. the scribe region 231. Therefore, the focal plane will not be pull down by the irrelevant region, e.g. the scribe region, and thus the pattern imaged onto the relevant region can be in focus.

According to various embodiments of the present disclosure, a focus metrology method includes recognizing at least one relevant region and at least one irrelevant region on a workpiece surface, measuring a height of the relevant region, and determining a focal length for an exposure process based on the measured height of the relevant region.

According to various embodiments of the present disclosure, a photolithography method includes recognizing at least one relevant region and at least one irrelevant region on a workpiece surface, measuring a first distance to the relevant region, determining a focal length based on the measured first distance to the relevant region, and focusing a pattern of light onto the workpiece surface with the focal length.

According to various embodiments of the present disclosure, a photolithography system includes a recognizer, a focus metrology tool, a controller and an exposure tool. The recognizer is configured to focus a pattern of light onto the workpiece surface with the focal length. The focus metrology tool is configured to measure a height of the relevant region. The controller is configured to determine a focal length based on the measured height of the relevant region. The exposure tool is configured to focus a pattern of light onto the workpiece surface with the focal length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A focus metrology method, comprising:
    recognizing at least one relevant region and at least one irrelevant region within at least one exposure field on a workpiece surface, wherein the relevant region is a region where at least one circuit pattern is to be formed, and the irrelevant region is within the exposure field but outside of the relevant region;
    disabling a first portion of a focus metrology tool corresponding to the irrelevant region, such that a second portion of the focus metrology tool remains active;
    measuring a height of the relevant region by the second portion of the focus metrology tool; and
    determining a focal length for an exposure process based on the measured height of the relevant region without considering the irrelevant region.

2. The focus metrology method of claim 1, wherein the measuring comprises:
    measuring topography of the relevant region.

3. The focus metrology method of claim 1, wherein the measuring comprises:
    directing a wave onto the workpiece surface;
    detecting reflected wave from the workpiece surface; and
    determining the height of the relevant region based on the reflected wave.

4. The focus metrology method of claim 3, wherein the wave is an electromagnetic wave.

5. The focus metrology method of claim 1, wherein the workpiece surface is a surface of a wafer, and the relevant region is a die area; and
    wherein the recognizing comprises:
    obtaining a position of a scribe region separating a plurality of the die areas on the surface of the wafer; and
    recognizing the scribe region as the irrelevant region based on the position of the scribe region.

6. A photolithography method, comprising:
    recognizing at least one die area where at least one circuit pattern is to be formed and at least one scribe region surrounding the die area within at least one exposure field on a workpiece surface;
    measuring a first distance to the die area and a second distance to the scribe region;
    determining a focal length based on the measured first distance to the die area, wherein the measured second distance to the scribe region is ignored when determining the focal length; and
    focusing a pattern of light onto the exposure field with the focal length to form the circuit pattern on the die area.

7. The photolithography method of claim 6, wherein the measuring comprises:
    measuring topography of the die area.

8. The photolithography method of claim 6, wherein the measuring comprises:
    directing a wave onto the workpiece surface;
    detecting reflected wave from the workpiece surface; and
    determining a height of the die area based on the reflected wave.

9. The photolithography method of claim 8, wherein the wave is an electromagnetic wave.

10. The photolithography method of claim 6, wherein the workpiece surface is a surface of a wafer; and
    wherein the recognizing comprises:
    obtaining a position of a scribe region on the surface of the wafer; and
    recognizing the scribe region based on the position of the scribe region.

11. A photolithography system, comprising:
    a recognizer configured to recognize at least one relevant region where at least one circuit pattern is to be formed and at least one irrelevant region within at least one exposure field on a workpiece surface, wherein the irrelevant region is a region within the exposure field but external to the relevant region;
    a focus metrology tool configured to measure a height of the relevant region;
    a controller configured to disable a first portion of the focus metrology tool corresponding to the irrelevant region, such that a second portion of the focus metrology tool remains active, control the second portion of the focus metrology tool to measure the height of the relevant region, and determine a focal length based on the measured height of the relevant region; and
    an exposure tool configured to focus a pattern of light onto the exposure field with with the focal length to form the circuit pattern on the relevant region.

12. The photolithography system of claim 11, wherein the focus metrology tool comprises:
    a surface metrology tool configured to measure topography of the relevant region.

13. The photolithography system of claim 11, wherein the focus metrology tool comprises:
    a wave source configured to provide a wave onto the workpiece surface;
    an imaging module configured to detect reflected wave from the workpiece surface; and
    an analyzer configured to determine the height of the relevant region based on the reflected wave.

14. The photolithography system of claim 11, wherein the workpiece surface is a surface of a wafer; and
wherein the recognizer is further configured to obtain a position of a scribe region separating a plurality as the relevant on the surface of the wafer and recognize the scribe region as the irrelevant region based on the position of the scribe region.

15. The photolithography system of claim 11, wherein the focus metrology tool comprises:
a wave source configured to provide a wave onto the workpiece surface;
an imaging module configured to detect reflected wave from the workpiece surface, wherein at least a part of the imaging module corresponding to the irrelevant region is capable of being individually disabled; and
an analyzer configured to determine the height of the relevant region based on the reflected wave.

16. The focus metrology method of claim 1, wherein the relevant region and the irrelevant region are recognized based on at least one pattern of a reticle, and the pattern of the reticle corresponds to the circuit pattern.

17. The focus metrology method of claim 1, wherein the measuring comprises:
splitting a wave into a first wave and a second wave;
directing the first wave onto the workpiece surface and the second wave onto a reference surface;
recombining reflected waves from the workpiece surface and the reference surface to create an interference wave; and
detecting the interference wave by the second portion of the focus metrology tool.

18. The photolithography method of claim 6, wherein the die area and the scribe region are recognized based on at least one pattern of a reticle, and the pattern of light is formed by directing light through the reticle.

19. The photolithography system of claim 11, wherein the focus metrology tool is and interferometer.

20. The photolithography system of claim 11, wherein the focus metrology tool is a displacement meter.

* * * * *